(12) United States Patent
Chen et al.

(10) Patent No.: US 9,088,300 B1
(45) Date of Patent: Jul. 21, 2015

(54) CYCLIC REDUNDANCY CHECK FOR OUT-OF-ORDER CODEWORDS

(71) Applicant: Marvell International Ltd., Hamilton (BM)

(72) Inventors: Zhengang Chen, San Jose, CA (US); Gregory Burd, San Jose, CA (US); Panu Chaichanavong, Don Muang (TH)

(73) Assignee: Marvell International Ltd., Hamilton (BM)

( * ) Notice: Subject to any disclaimer, the term of this patent is extended or adjusted under 35 U.S.C. 154(b) by 120 days.

(21) Appl. No.: 13/713,844

(22) Filed: Dec. 13, 2012

Related U.S. Application Data

(60) Provisional application No. 61/576,302, filed on Dec. 15, 2011.

(51) Int. Cl.
  *H03M 13/00* (2006.01)
  *H03M 13/09* (2006.01)

(52) U.S. Cl.
  CPC .................................... *H03M 13/09* (2013.01)

(58) Field of Classification Search
  CPC ............ H03M 13/091; H03M 13/6575; H04L 1/0061; H04L 12/5601; H04L 1/004; H04L 1/0072; H04L 2012/5627; H04L 2012/5656; H04L 45/742; H04L 2001/0094; G06F 11/10; G06F 11/1004; G06F 11/2294; G06F 3/1454; G06F 3/1462
  USPC .................. 714/758, E11.032, 776, 781, 807, 714/E11.04, 708, 746, 751, 752, 757, 763, 714/779, 801
  See application file for complete search history.

(56) References Cited

U.S. PATENT DOCUMENTS

| | | | |
|---|---|---|---|
| 5,410,546 A * | 4/1995 | Boyer et al. ................... | 714/763 |
| 6,223,320 B1 * | 4/2001 | Dubey et al. ................... | 714/757 |
| 2004/0187064 A1 * | 9/2004 | Takahashi et al. ............ | 714/758 |
| 2005/0005224 A1 * | 1/2005 | Ridgeway et al. ............. | 714/758 |
| 2006/0039465 A1 * | 2/2006 | Emerson et al. ......... | 375/240.01 |
| 2007/0234177 A1 * | 10/2007 | Jeon et al. ...................... | 714/758 |
| 2008/0046797 A1 * | 2/2008 | Allen et al. .................... | 714/758 |
| 2012/0192044 A1 * | 7/2012 | Shafai et al. ................... | 714/807 |

* cited by examiner

*Primary Examiner* — Guy Lamarre

(57) ABSTRACT

Systems, methods, apparatus, and techniques are provided for decoding data. A plurality of codewords are received in a first order, the first order different from a second order in which the plurality of codewords was encoded, a CRC check is initiated in the first order on each of the plurality of codewords to produce a respective plurality of codeword-level CRC values, the plurality of codeword-level CRC values is combined to produce an overall CRC sequence, and it is determined if there is an error in the plurality of codewords based on the overall CRC sequence.

15 Claims, 4 Drawing Sheets

US 9,088,300 B1

CYCLIC REDUNDANCY CHECK FOR OUT-OF-ORDER CODEWORDS

CROSS-REFERENCE TO RELATED APPLICATIONS

This patent application claims the benefit under 35 U.S.C. §119(e) of U.S. Provisional Application No. 61/576,302, filed Dec. 15, 2011, which is hereby incorporated by reference herein in its entirety.

FIELD OF USE

This disclosure relates to cyclic redundancy check (CRC)-based error detection codes that are combined with error correction codes and used to encode data prior to writing to a storage medium and to detect errors in data read from the storage medium.

BACKGROUND OF THE DISCLOSURE

Combined error detection and error correction codes typically exhibit poor performance when out-of-order codewords are received. For example, in one approach, a length of data (e.g., a sector of data) is parsed into N codewords and each codeword is individually encoded with both an error detection code (EDC) and an error correction code (ECC). Although individual codewords may be decoded independently, this approach is inefficient as it requires dedicated EDC coding for each codeword and, correspondingly, that extra information be stored and transmitted.

In another approach, EDC coding is applied across a number of codewords rather than to codewords individually. This approach may handle out-of-order codewords by waiting to receive the number of codewords, resequencing the codewords, and then performing EDC decoding. However, in this approach, a large buffer is required to store codewords that are received out of order until a sufficient number of consecutively sequenced codewords is received. Further, the buffering of codewords in this manner may lead to large decoding time delays and increased memory requirements.

SUMMARY OF THE DISCLOSURE

Described herein are techniques for generating an overall CRC sequence for encoding data. Data comprising a plurality of codewords is received. For each codeword in the plurality of codewords, a partial CRC sequence for the codeword is determined and the codeword-level CRC sequence for each codeword in the plurality of codewords is combined to produce the overall CRC sequence. It is determined if there is an error in the data based on the overall CRC sequence.

Also described herein is a system for generating an overall CRC sequence for encoding data. The system comprises an ECC encoder configured to receive data comprising a plurality of codewords, for each codeword in the plurality of codewords, determine a partial CRC sequence for the codeword and combine the codeword-level CRC sequence for each codeword in the plurality of codewords to produce the overall CRC sequence, and determine if there is an error in the data based on the overall CRC sequence.

Further described herein are techniques for decoding data. A plurality of codewords is received in a first order, the first order different from a second order in which the plurality of codewords was encoded. A CRC check is initiated, in the first order, on each of the plurality of codewords to produce a respective plurality of codeword-level CRC values. The plurality of codeword-level CRC values is combined to produce an overall CRC sequence. It is determined if there is an error in the plurality of codewords based on the overall CRC sequence.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which.

DETAILED DESCRIPTION OF THE DISCLOSURE

The disclosed technology relates generally to CRC encoding and decoding structures for write and read paths in data systems, respectively. More particularly, the disclosed technology relates to new encoding and decoding architectures and techniques for processing codewords that may be read in an arbitrary (e.g., out-of-order) sequence from a storage media.

Figure 1:
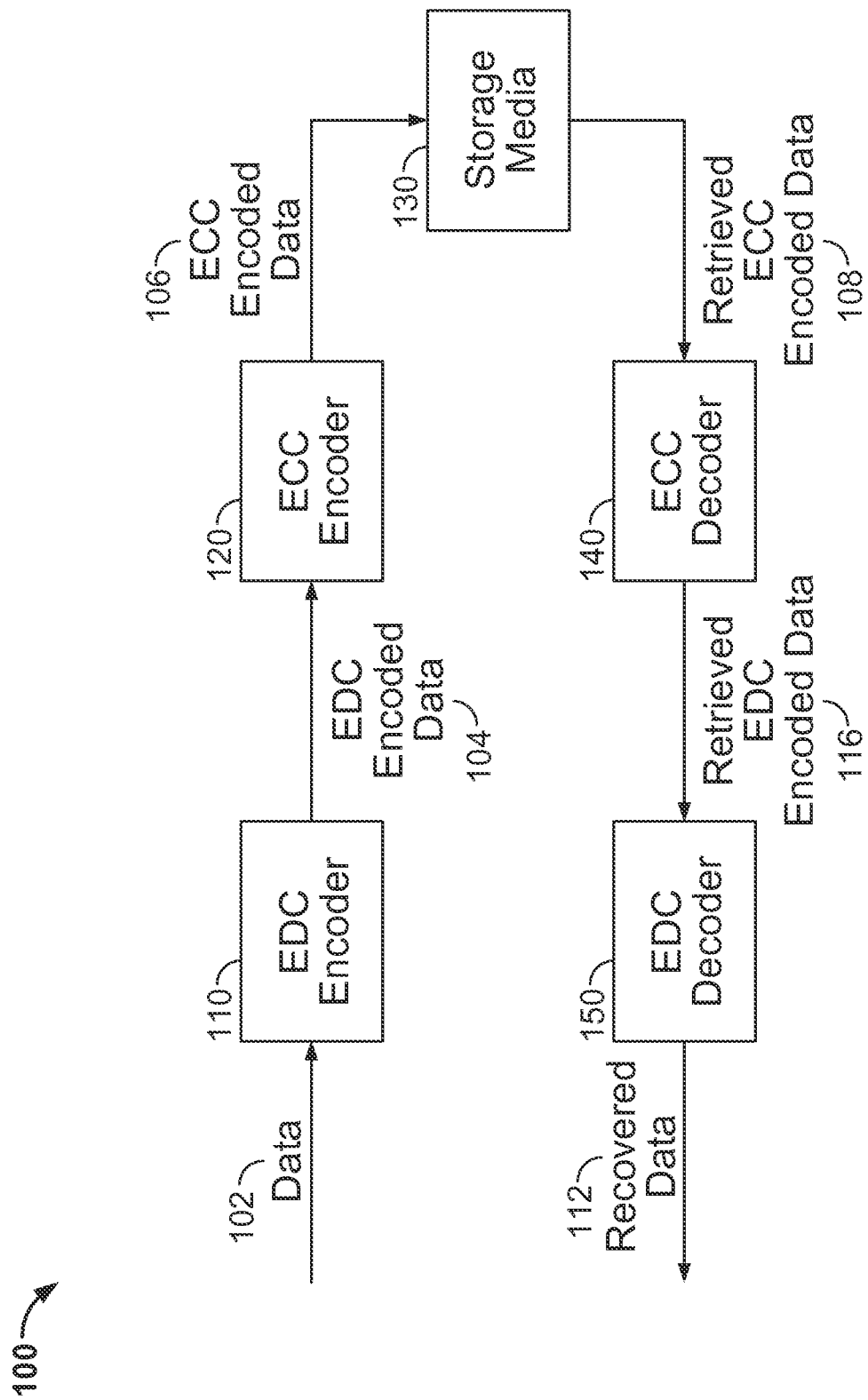
FIG. 1 illustrates an exemplary data encoding and decoding architecture utilizing an error detection code and an error correction code in accordance with an arrangement.
Figure 2:
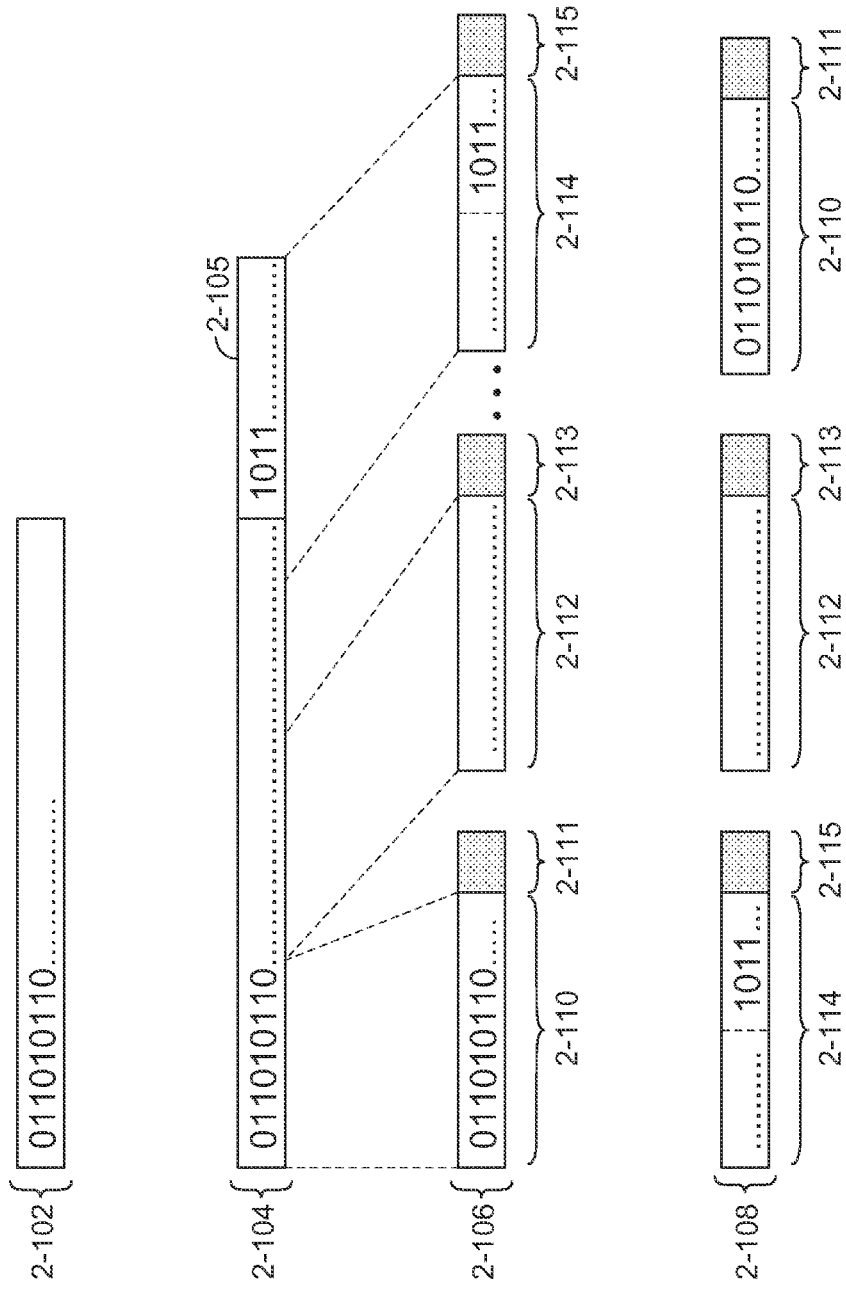
FIG. 2 illustrates exemplary data structures produced by a data encoding and decoding architecture utilizing an error detection code and an error correction code in accordance with an arrangement.

FIG. 1 illustrates an exemplary data encoding and decoding architecture utilizing an error detection code and an error correction code in accordance with an arrangement. Architecture 100 includes an EDC encoder 110 and an ECC encoder 120 for encoding data 102. The data 102 corresponds to a fixed-length sequence of bits produced by a data source. For example, in an arrangement, the data 102 is a sequence of approximately 10,000 bits produced by a computer device or some other suitable source. With reference to FIG. 2, which illustrates exemplary data structures produced by a data encoding and decoding architecture utilizing an error detection code and an error correction code in accordance with an arrangement, data 2-102 is an illustrative example of the data 102, in which the first nine bits correspond to the sequence 011010110.

Referring back to FIG. 1, the EDC encoder 110 processes the data 102 to produce CRC parity check bits. For example, in an arrangement, the EDC encoder 110 produces 32 CRC parity check bits having values determined based on the values of the data 102. The EDC encoder 110 then appends the CRC parity check bits to the data 102 to form EDC encoded data 104. With reference to FIG. 2, EDC encoded data 2-104 is an illustrative example of the EDC encoded data 104 in which CRC check bits 2-105 are appended to the data 2-102 to produce the EDC encoded data 2-104.

Referring back to FIG. 1, the EDC encoded data 104 is provided to the ECC encoder 120, which determines and inserts error correction bits onto the EDC encoded data 104 on a per-codeword basis. In particular, the ECC encoder 120 first parses the EDC encoded data 104 into individual codewords, determines error correction bits for each respective codeword based on the data of the codeword, and appends the determined error correction bits onto each respective codeword. The ECC encoder 120 then outputs ECC encoded data 106. The function of the ECC encoder 120 is illustrated in FIG. 2. As illustrated, the ECC encoder processes the EDC encoded data 2-104 to produce the ECC encoded data 2-106. Specifically, the ECC encoder 120 parses the EDC encoded data 2-104 into constituent codewords, codewords 2-110, 2-112, 2-114, and so on. The ECC encoder 120 includes the CRC check bits 2-105 as part of the last codeword 2-114.

Next, the ECC encoder 120 determines and appends error correction bits 2-111, 2-113, and 2-115 to the codewords 2-110, 2-112, and 2-114, respectively. Further, the ECC encoder 120 may determine the error correction bits 2-111, 2-113, and 2-115 as a function of the codewords 2-110, 2-112, and 2-114, respectively, through any suitable scheme. For example, the ECC encoder 120 may determine the error correction bits according to a Reed-Solomon, Golay, BCH, or multidimensional parity block encoding scheme.

Returning to FIG. 1, the ECC encoded data 106 is provided to storage media 130. The storage media 130 may correspond to any device or media capable of storing digital information. For example, the storage media 130 may correspond to a floppy diskette, CD-ROM or DVD disc, a storage medium accessible by cloud storage, a jump drive or USB flash drive, or a backup tape. At some point after storage on the storage media 130, the ECC encoded data 106 is retrieved as retrieved ECC encoded data 108.

The architecture 100 includes an ECC decoder 140 and EDC decoder 150 for decoding the retrieved ECC encoded data 108. The ECC decoder 140 processes parity bits present in the retrieved ECC encoded data 108 and outputs a data stream that includes CRC check bits, i.e., retrieved EDC encoded data 116. As an illustrative example, the retrieved EDC encoded data 116 may be a recovered version of the EDC encoded data 2-104. The EDC decoder 150 detects whether any errors are present in the retrieved EDC encoded data 116 by performing a parity check based on CRC check bits included in the retrieved EDC encoded data 116.

If the parity check indicates that no errors are present in the retrieved EDC encoded data 116, then the EDC decoder 150 strips the CRC check bits from the retrieved EDC encoded data 116 to produce recovered data 112. If, on the other hand, the parity check indicates that errors are present in the retrieved EDC encoded data 116, then the EDC decoder declares that an error is present and may additionally output a decoded version of the retrieved EDC encoded data 116 (i.e., which contains one or more errors) as the recovered data 112.

With reference to FIG. 2, the ECC encoded data 2-106 includes multiple constituent codewords, i.e., the codeword 2-110, the codeword 2-112, and the codeword 2-114, arranged in a certain sequence at the output of the ECC encoder 120. However, these same codewords (or corrupted versions thereof) may be arranged in a different order in the retrieved ECC encoded data 108. For example, the codewords 2-110, 2-112, and 2-114 (and their corresponding error correction bits 2-111, 2-113, and 2-115, respectively) may, when retrieved, appear in the order specified by retrieved EDC encoded data 2-108.

Before describing how the ECC encoder 110 appends CRC check bits (e.g., the CRC check bits 2-105) to data (e.g., the data 2-102) or how the EDC decoder 150 detects errors based on the appended CRC check bits in the case of multiple concatenated codewords, it is instructive to describe CRC checking in general terms. Generally, a set of k binary data symbols, $u_0, \ldots u_{k-1}$, may be represented by a corresponding data polynomial $$u(x) = u_{k-1} x^{k-1} + \ldots + u_2 x^2 + u_1 x + u_0, \quad (1)$$

where each of the data symbols $u_0, \ldots u_{k-1}$ takes on a value of 0 or 1. The k data symbols are mapped into an n symbol codeword $$c(x) = c_{n-1} x^{n-1} + \ldots + c_2 x^2 + c_1 x + c_0,$$

where each of the data symbols $c_0, \ldots c_{n-1}$ takes on a value of 0 or 1, based on a generator polynomial of order n−k $$g(x) = x^{n-k} + g_{n-k-1} x^{n-k-1} + \ldots + c_2 x^2 + c_1 x + c_0,$$

where each of the generator symbols $g_0, \ldots g_{n-k-1}$ takes on a value of 0 or 1.

Specifically, a parity check polynomial is derived from the data polynomial and the generator polynomial according to the following relationship $$p(x) = [u(x) x^{n-k}] \bmod g(x) = p_{n-k-1} x^{n-k-1} + \ldots + p_2 x^2 + p_1 x + p_0, \quad (2)$$

and the resultant parity check symbols, $p_0, \ldots p_{n-k-1}$, which take on values of 0 or 1, are appended to the data symbols to create a codeword of the form $$u_{k-1}, \ldots, u_1, u_0, p_{n-k-1}, \ldots, p_1, p_0.$$

As would be understood by one of ordinary skill in the art, based on the disclosure and teachings herein, the parity check symbols, $p_0, \ldots p_{n-k-1}$, may be derived using a linear shift register.

Next, consider the case of ECC encoded data (e.g., the ECC encoded data 2-106) that includes multiple codewords (e.g., the codewords 2-110, 2-112, and 2-114). A technique for performing CRC (i.e., encoding and decoding operations) for out-of-order codewords is presented which advantageously requires no extra CRC bits to be written to media as compared to a CRC technique which corrects only for in-order codewords. Further, a minimum distance of the CRC code is not reduced compared to a CRC technique which corrects only for in-order codewords.

For illustrative purposes, consider the particular case where the ECC encoded data includes exactly four codewords which may be of varying lengths. In particular, denote the four codewords by $u_0(x)$, $u_1(x)$, $u_2(x)$, and $u_3(x)$, where $u_i(x) = [u_{k_i}, \ldots u_1 u_0]$ are the data symbols of the $i^{th}$ codeword of the ECC encoded data and $k_i$ is the length, in symbols, of $u_i(x)$. In order to decode out of order codewords, it is advantageous to treat each codeword as if it has been zero-padded so that it shares a common length L with the other codewords. Specifically, let L be any integer value larger than the maximum of $k_1$ through $k_4$.

Under the assumption that a number of zeros are appended to each of the codewords $u_0(x)$, $u_1(x)$, $u_2(x)$, and $u_3(x)$, so that the resultant modified codeword has a length of L, equation (1) for the multi-codeword case may be written $$p(x) = \{[u_0(x) x^{3L} + u_1(x) x^{2L} + u_2(x) x^L + u_3(x)] x^{n-k}\} \bmod g(x)$$

and exploiting the general property of the modulo operator that $(A+B) \bmod C = (A \bmod C + B \bmod C) \bmod C$ the parity check polynomial may be written $$p(x) = \{[u_0(x) x^{3L+n-k}] \bmod g(x) + [u_1(x) x^{2L+n-k}] \bmod g(x) + [u_2(x) x^{L+n-k}] \bmod g(x) + [u_3(x) x^{n-k}] \bmod g(x)\} \bmod g(x). \quad (3)$$

To understand how the parity check polynomial of equation (3) lends itself to the above-described advantages, it instructive to let $p_i$ denote the parity check vector for the codeword $u_i(x)$ (i.e., without any zero-padding added to the codeword $u_i(x)$). Then equation (3) can be rewritten $$p(x)=[(p_0x^{3L}) \bmod g(x)+(p_1x^{2L}) \bmod g(x)+(p_2x^L) \bmod g(x)+p_3 \bmod g(x)] \bmod g(x). \qquad (4)$$

Next, noting that the operation $p_2x^L \bmod g(x)$ is equivalent to multiplying the vector $p_2$ with a $(n-k)\times(n-k)$ binary matrix D (i.e., a matrix that is fixed since the value of L is fixed), it follows that $(p_2 x^L) \bmod g(x)=p_2 D$. Similarly, $(p_1 x^{2L}) \bmod g(x)=p_1 D^2$ and $(p_0 x^{3L}) \bmod g(x)=p_0 D^3$. Thus, equation (4) may be rewritten $$p(x)=p_0D^3+p_1D^2+p_2D+p_3. \qquad (5)$$

Further, one of ordinary skill in the art would understand, based on the disclosure and teachings herein, that the derivations above are easily generalizable to case where ECC encoded data includes any number of constituent codewords. In particular, in the general case, the ECC encoded data includes N codewords, denoted by $u_0(x)$, $u_1(x)$, $u_2(x)$, and $u_{N-1}(x)$, where $u_i(x)=[u_{ki-1} \ldots u_1 u_0]$ are the data symbols of the $i^{th}$ codeword of the ECC encoded data and $k_i$ is the length, in symbols, of $u_i(x)$.

Letting L be any integer value larger than the maximum of $k_1$ through $k_N$, and under the assumption that a number of zeros are appended to each of the codewords $u_0(x)$, $u_1(x)$, $u_2(x)$, and $u_{N-1}(x)$, the parity check equation is expressed $$p(x)=p_0D^{N-1}+p_1D^{N-2}+\ldots+p_{N-2}D+p_{N-1}, \qquad (6)$$

where $p_i$ denotes the parity check vector for the codeword $u_i(x)$ (i.e., without any zero-padding added to the codeword $u_i(x)$) and D is the $(n-k)\times(n-k)$ parity check matrix defined through the equation $(p_{N-2}x^L) \bmod g(x)=P_{N-2}D$. As would be understood by one of ordinary skill, based on the disclosure and teachings herein, encoding is performed in order for certain applications. In those applications, a conventional CRC encoding write path architecture may be used for encoding data in place of the architecture 300.

In equation (6), the matrix D is a function of the value of L, which is chosen to be any arbitrary value greater than the maximum of $k_1$ through $k_N$. Accordingly, in an arrangement, the value of L is chosen to produce a value of D that optimizes (i.e., reduces) a computational complexity associated with the evaluation of the parity check equation (6). For example, in an arrangement, multiple simulations are run based on different values of L and an average encoding (or decoding, or both) complexity is determined at each value of L. In this arrangement, the value of L producing the least complexity in encoding and decoding is selected.

Figure 3:
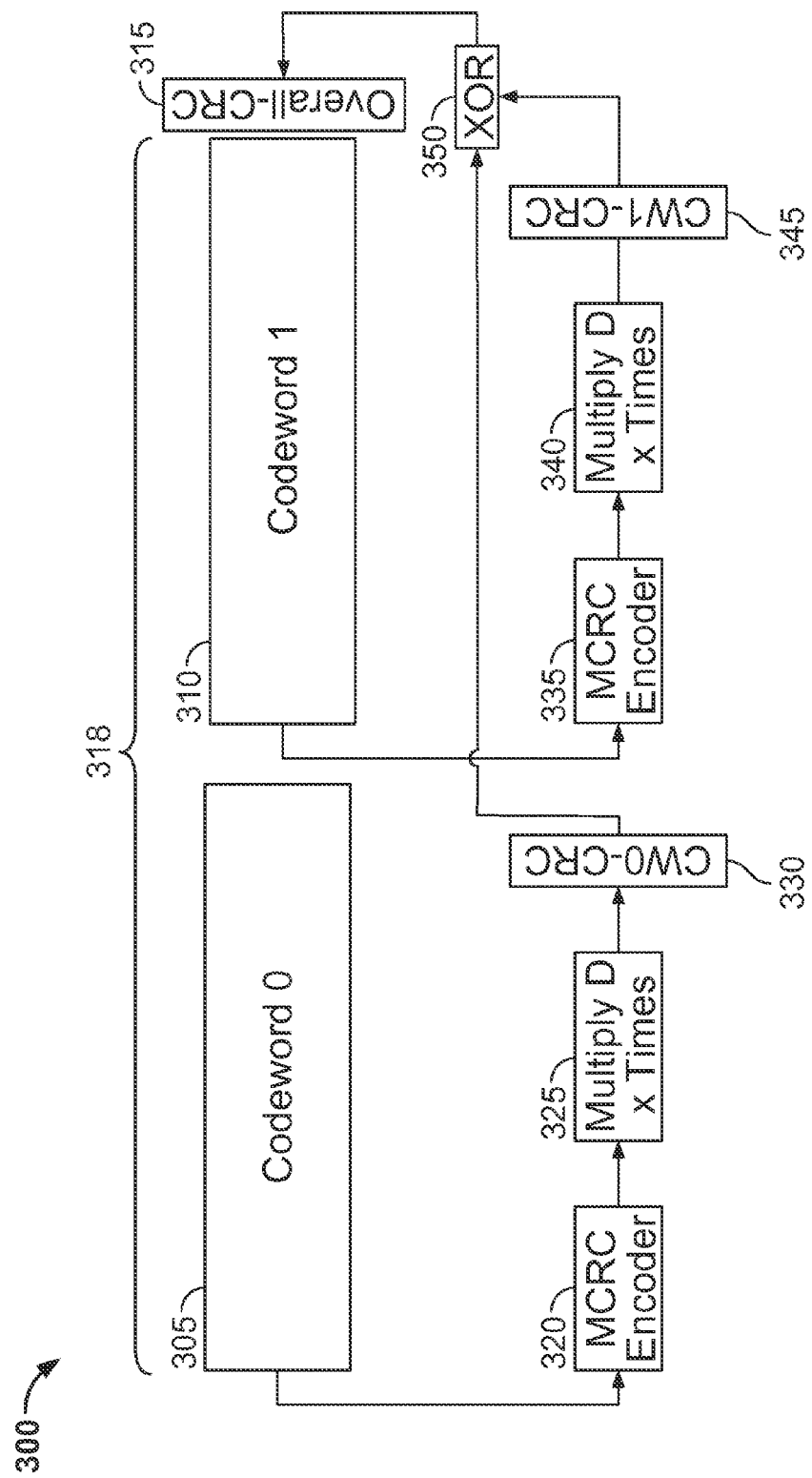
FIG. 3 illustrates an exemplary CRC encoding write path architecture for encoding data in accordance with an arrangement.

FIG. 3 illustrates an exemplary CRC encoding write path architecture for encoding data according to an arrangement. In particular, architecture 300 illustrates encoding based on the equation (6) for the special case that N=2. In that case, the data 102 consists of two codewords and the parity check matrix p(x) is expressed $$p(x)=p_0D+p_1.$$

As indicated in the architecture 300, the two constituent codewords of the data 102, codeword 0 305 and codeword 1 310, are stored in respective registers, and have dedicated CRC generation circuitry. In particular, MCRC encoder 320 generates the parity vector $p_0$ corresponding to the codeword 0 305 and MCRC encoder 335 generates the parity vector $p_1$ corresponding to the codeword 1 310.

Next, multipliers 325 and 340 multiply their respective input parity vectors by the matrix D raised to the power indicated in equation (6). In particular, each of the multipliers 325 and 340 multiplies its respective input vector by the matrix raised to the power v, where v is given by the equation $$v=N-1-CW\_ID,$$

where N is again the number of constituent codewords in the data 102 and CW_ID is the index value of the codeword being encoded by the multiplier. In FIG. 3, N=2 and CW_ID=0 for the MCRC encoder 320 and CW_ID=1 for the MCRC encoder 335. Accordingly, the multiplier 325 multiplies $p_0$ by $D^1$ and the multiplier 340 multiplies $p_1$ by $D^0=1$. The outputs of the multipliers 325 and 340 are the CRC terms corresponding to the codewords 0 305 and 1 310, respectively, and are stored in registers 330 and 345, respectively. Finally, the CRC results stored in the registers 330 and 345 are exclusive-ORed by XOR circuitry 350 and the net result, the overall CRC value for the data 318, is stored in register 315.

On the read path corresponding to the write path of the architecture 300, CRC values are calculated on a per-codeword basis. In particular, when a constituent codeword of data is read, the CRC term for that codeword, $p_iD^j$ is computed, where i and j are determined from the equation (6). Once CRC values for all constituent codewords have been determined (possibly in an out of order sequence), the individual results are exclusive-ORed to produce a single overall parity check value for the data. If the parity check value is all-zero, the codeword is declared to be error free. Otherwise, the codeword is declared to contain one or more errors.

As would be understood by one of ordinary skill, based on the disclosure and teachings herein, in alternative arrangements, some of the circuitry depicted in FIG. 3 may be reused across multiple codewords, rather than being dedicated to a given codeword position as depicted in FIG. 3. For example, in one arrangement, the MCRC encoder 320 (or equivalently, the MCRC encoder 335) is the sole MCRC encoder used to encode both the codeword 0 305 and the codeword 1 310 (or however many codewords are encoded by a single EDC sequence). In another arrangement, the multiplier 325 (or equivalently, the multiplier 340) is the sole multiplier used to multiple input parity vectors by the matrix D raised to the power indicated in equation (6). In yet another arrangement, both the MCRC encoder 320 (or equivalently, the MCRC encoder 335) and the multiplier 325 (or equivalently, the multiplier 340) are used as the sole encoder and multiplier, respectively, of a CRC encoding write path architecture.

In an arrangement, the multiplier 325 (and/or the multiplier 340) is implemented using dedicated circuitry for each potential value of v in the equation v=N-1-CW_ID. In another arrangement, the multiplier 325 (and/or the multiplier 340) is implemented using single circuit containing logic for implementing the matrix D. In this arrangement, to compute the quantity $D^v$, the logic for implementing the matrix D is used v times.

Further, while the quantity v is described above as being given by the equation v=N-1-CW_ID, in an alternate arrange, the quantity v may be instead set equal to the index value of the codeword being encoded by the multiplier, i.e., v=CW_ID.

Figure 4:
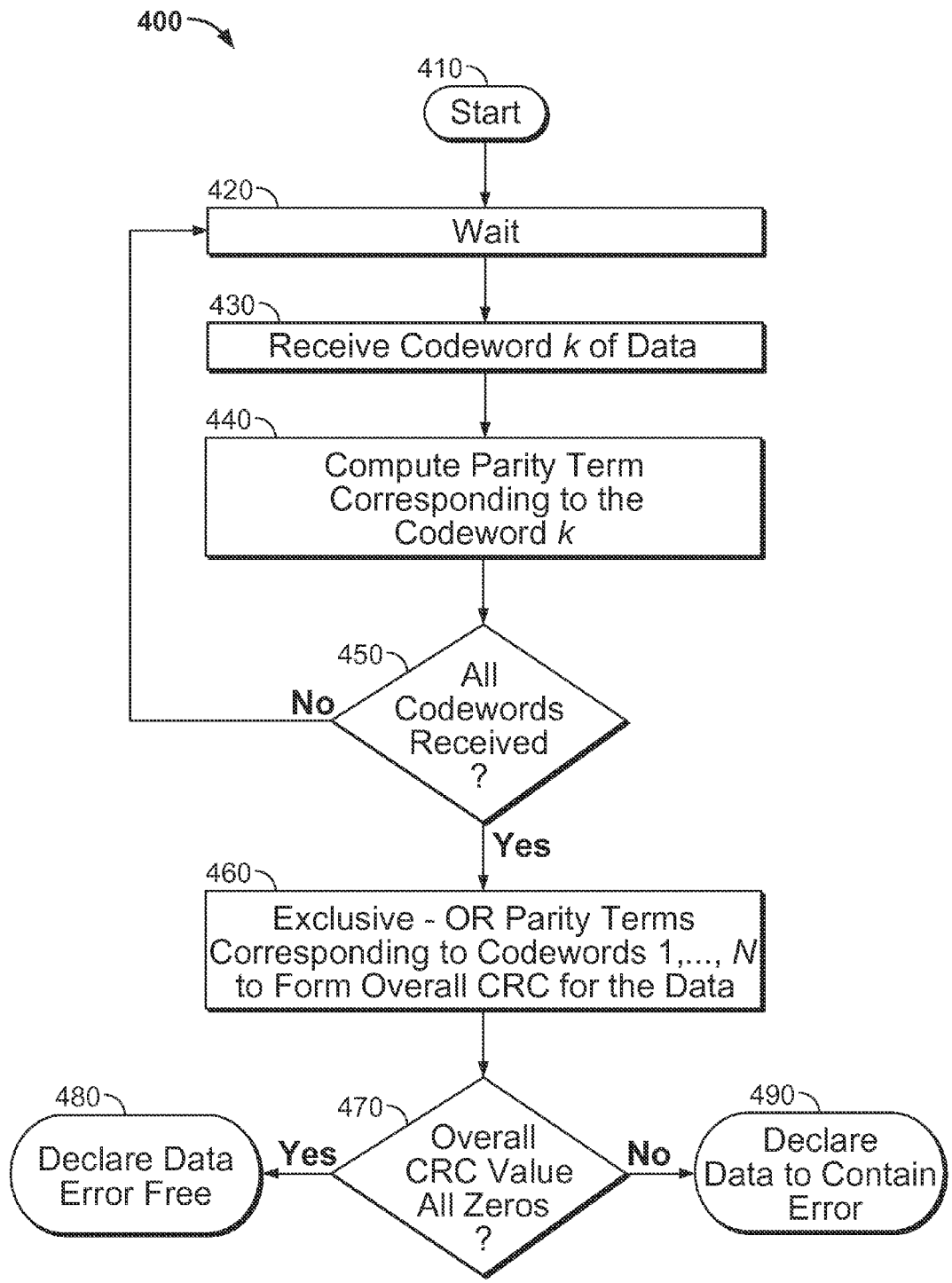
FIG. 4 illustrates an exemplary process employed by read-path circuitry to determine an overall CRC value corresponding to data that includes a plurality of constituent codewords in accordance with an arrangement.

FIG. 4 illustrates an exemplary process employed by read-path circuitry to determine an overall CRC value corresponding to data that includes a plurality of constituent codewords in accordance with an arrangement. Process 400 begins at 410. At 420, the process 400 waits to receive one of N constituent codewords (labeled with indices 0 through N-1) of the data. As described previously, codewords may be received out of order by the read path. Eventually, the process 400 will receive a codeword k at 430. At 440, the process 400 computes the parity term corresponding to the codeword k based on equation (6), i.e., computes the term $p_kD^{N-1-k}$. At 450, the process 400 determines whether all codewords (i.e., codewords 0 through N−1) have been received. If so, the process 400 continues to 460. Otherwise, the process 400 returns to 420 and waits to receive another codeword.

At 460, the process 400 exclusive-ORs each of the individual parity terms computed at 440 to produce an overall CRC value for the data, i.e., computes $$p(x)=p_0D^{N-1}+p_1D^{N-2}+\ldots+p_{N-2}D+p_{N-1}.$$

The process 400 then proceeds to 470. At 470, the overall CRC value is evaluated to determine with is takes on all zero values. If so, the process 400 proceeds to 480, where the data is declared error free. Otherwise, the process 400 proceeds to 490, where the data is declared to contain one or more errors.

Therefore, the read path of FIG. 4 is able to process out-of-order codewords. In particular, because equation (6) decouples an overall parity calculation into codeword-wise terms, individual codewords can be received in any sequence without undue latency or delay in computing a CRC value. Among other advantages, the proposed technique eliminates or reduces the need to buffer received codewords until a full set of codewords corresponding to data is received.

The above described implementations are presented for the purposes of illustration and not of limitation. Other embodiments are possible and one or more parts of techniques described above may be performed in a different order (or concurrently) and still achieve desirable results. In addition, techniques of the disclosure may be implemented in hardware, such as on an application specific integrated circuit (ASIC) or on a field-programmable gate array (FPGA). The techniques of the disclosure may also be implemented in software.

What is claimed is:

1. A method for updating an overall cyclic redundancy check (CRC) sequence for encoding data, the method comprising:
receiving data comprising a plurality of codewords, wherein:
each codeword has a bit-length, and
a first codeword and a second codeword in the plurality of codewords have different bit-lengths;
for each codeword in the plurality of codewords, determining a partial CRC sequence for the codeword;
modifying, to obtain a plurality of codeword-level CRC sequences, the partial CRC sequence for each codeword, based on a pre-specified bit-length parameter L that is at least as large as a maximum of the bit-lengths; and
combining one of the plurality of the codeword-level CRC sequences with the overall CRC sequence to update the overall CRC sequence.

2. The method of claim 1, wherein modifying the partial CRC sequence based on the pre-specified bit-length parameter L comprises multiplying the partial CRC sequence by a fixed matrix for a number of times based on a codeword index CW_ID.

3. The method of claim 1, further comprising appending the overall CRC sequence to the data.

4. The method of claim 1, wherein combining the one of the plurality of the codeword-level CRC sequences with the overall CRC sequence comprises exclusive-ORing, on a bitwise basis, bits of the one of the plurality of the codeword-level CRC sequences with bits of the overall CRC sequence.

5. The method of claim 1, further comprising determining the maximum bit-length parameter L based on a computational complexity of multiplying a partial CRC sequence by a fixed matrix.

6. A system for updating an overall CRC sequence for encoding data, the system comprising an EDC encoder configured to:
receive data comprising a plurality of codewords, wherein:
each codeword has a bit-length, and
a first codeword and a second codeword in the plurality of codewords have different bit-lengths;
for each codeword in the plurality of codewords, determine a partial CRC sequence for the codeword;
modify, to obtain a plurality of codeword-level CRC sequences, the partial CRC sequence for each codeword, based on a pre-specified bit-length parameter L that is at least as large as the maximum of the bit-lengths; and
combine one of the plurality of the codeword-level CRC sequences with the overall CRC sequence to update the overall CRC sequence.

7. The system of claim 6, wherein the EDC encoder is further configured to modify the partial CRC sequence based on the pre-specified bit-length parameter L by multiplying the partial CRC sequence by a fixed matrix for a number of times based on a codeword index CW_ID.

8. The system of claim 6, wherein the EDC encoder is further configured to combine the overall CRC sequence with the data by appending the overall CRC sequence to the data.

9. The system of claim 6, wherein the EDC encoder is further configured to combine the one of the plurality of the codeword-level CRC sequences with the overall CRC sequence by exclusive-ORing, on a bitwise basis, bits of the one of the plurality of the codeword-level CRC sequences with bits of the overall CRC sequence.

10. The system of claim 6, wherein the EDC encoder is further configured to determine the maximum bit-length parameter L based on a computational complexity of multiplying a partial CRC sequence by a fixed matrix.

11. A method for decoding data comprising:
receiving a plurality of codewords in a first order, wherein:
the first order is different from a second order in which the plurality of codewords was encoded,
each codeword has a bit-length, and
a first codeword and a second codeword in the plurality of codewords have different bit-lengths;
initiating, in the first order, a CRC check on each of the plurality of codewords to produce a respective plurality of codeword-level CRC values;
modifying each of the plurality of codeword-level CRC values, based on a pre-specified bit-length parameter L that is at least as large as a maximum of the bit-lengths;
combining one of the plurality of modified codeword-level CRC values with an overall CRC sequence to update the overall CRC sequence; and
determining if there is an error in the plurality of codewords based on the updated overall CRC sequence.

12. The method of claim 11, wherein modifying each of the plurality of codeword-level CRC values comprises multiplying each of the plurality of codeword-level CRC values by a fixed matrix for a number of times based on a codeword index.

13. The method of claim 11, wherein combining the one of the plurality of modified codeword-level CRC values with the overall CRC sequence comprises exclusive-ORing, on a bitwise basis, bits of the one of the plurality of codeword-level CRC values with bits of the overall CRC sequence.

14. The method of claim 12, wherein the maximum bit-length parameter L is determined based on a computational complexity of multiplying a codeword-level CRC value by a fixed matrix.

15. The method of claim 11, wherein the CRC check on a codeword from the plurality of codewords is performed based on a BCH coding scheme.

\* \* \* \* \*